United States Patent [19]

Upadhyayula

[11] 3,991,328

[45] Nov. 9, 1976

[54] PLANAR TRANSFERRED ELECTRON LOGIC DEVICE

[75] Inventor: Chainulu Lakshminarasimha Upadhyayula, East Windsor, N.J.

[73] Assignee: RCA Corporation, New York, N.Y.

[22] Filed: June 24, 1975

[21] Appl. No.: 589,855

[52] U.S. Cl. .................. 307/299 R; 331/107 G; 357/3
[51] Int. Cl.² .................. H03K 3/26; H03F 1/36; H01L 27/26
[58] Field of Search ............... 307/299; 331/107 G; 357/3

[56] References Cited

UNITED STATES PATENTS

| | | | |
|---|---|---|---|
| 3,447,044 | 5/1969 | Sandbank et al. | 331/107 G |
| 3,538,400 | 11/1970 | Yanai et al. | 331/107 G |
| 3,588,736 | 6/1971 | McGroddy | 331/107 G |
| 3,602,734 | 8/1971 | Matsukura et al. | 307/299 |
| 3,766,372 | 10/1973 | Kataoka et al. | 357/3 |

OTHER PUBLICATIONS

"Oscillator" by Esposito et al. – IBM Tech. Discl. Bull., vol. 12, No. 11, Apr. 1970, pp. 1755–1756.

*Primary Examiner*—Stanley D. Miller, Jr.
*Attorney, Agent, or Firm*—Edward J. Norton; Robert L. Troike

[57] ABSTRACT

A planar transferred electron device is biased such that the voltage across the anode and cathode electrodes is above that of a threshold voltage in the presence of which the device is characterized by a transfer of electrons from a high to a low mobility sub-band and the formation of domains. A reverse biasing potential is applied between the gate and cathode electrodes which is of sufficient magnitude to cause in the quiescent state the suppression of the formation of these domains. When signals above a given level are provided between the gate and cathode electrodes, the device operates according to a transferred electron effect including the formation of the domains.

3 Claims, 5 Drawing Figures

PLANAR TRANSFERRED ELECTRON LOGIC DEVICE

This invention herein described was made in the course of or under the contract or subcontract with the Department of the Navy.

BACKGROUND OF THE INVENTION

This invention relates to planar transferred electron devices (TED) and more particularly to signal processing apparatus utilizing such transferred electron devices. Transferred electron devices are also referred to as Gunn devices. Planar transferred electron logic devices (TED) offer switching speeds on the order of 20 to 50 pico-seconds with delay-dissipation products of 1 to 2 pico-joules. Such speeds are not possible with CMOS (Complementary MOS) or ECL (Emitter Coupled Logic) devices. Such planar transferred electron devices are particularly useful for performing gigabit rate signal processing, Fast Fourier Transforms, etc.

Basically, TED logic devices comprise a body of transferred electron effect material such as gallium arsenide. This material has a length, thickness and doping density such that the body is characterized by a transfer of electrons from a high to a low mobility subband and the formation of domains in the presence of a proper biasing potential above threshold. Such devices usually have a product of length times the doping density or $nl$ product greater than $1 \times 10^{13}$ cm$^{-2}$ and a doping density times thickness that is greater than $1 \times 10^{12}$ cm$^{-2}$. A cathode terminal is located on the top surface of the body near one end and an anode terminal is located on the top surface of the body near the end opposite the cathode end.

In the prior art devices, the biasing potential across the cathode and anode terminal is determined in the quiescent state at a value slightly below that of threshold. A typical device is operated from 0.9 to 0.95 times threshold. A gate electrode is located close to the cathode. When input signals applied to the gate electrode are of sufficient magnitude to increase the value of the electric field above that of threshold, domains are formed and the device changes state from a relatively high current state to a low current state. Since the biasing voltage in the quiescent state must be 0.9 to 0.95 times threshold, the power dissipation in such a device is considerable, for example (from 100 – 200 milliwatts). Also, small noise signals and fluctuations in the biasing voltage can cause false triggering of the device into the lower current state.

BRIEF DESCRIPTION OF INVENTION

Briefly, a TED logic device can be provided which, compared to prior art devices, has substantially less power dissipation in the quiescent state and is less susceptible to small noise signals which can cause false triggering of the device. This device like that of the prior art devices includes a planar body of transferred electron material with a cathode terminal at one end and an anode terminal at the opposite end and a gate terminal near the cathode terminal. In the arrangement described herein, the biasing voltage across the cathode and anode terminals is determined in the quiescent state to be above that of threshold. The magnitude of a reverse biasing potential provided between the gate and cathode terminals in the quiescent state is sufficient to prevent the formation of domains. Control signals applied between the gate and cathode terminals of a sufficient magnitude cause the device, by offsetting the reverse bias, to change state from a relatively low current state to a higher current state associated with the formation of domains.

DETAILED DESCRIPTION OF INVENTION

A more detailed description follows in conjunction with the following drawing wherein.

Figure 1:
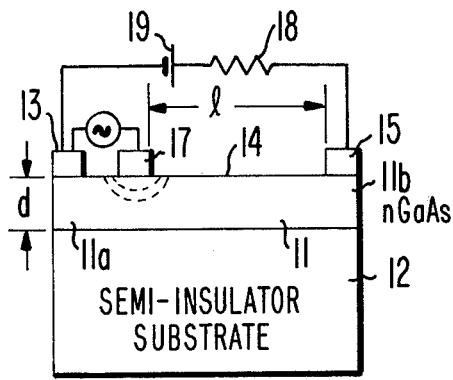
FIG. 1 is a functional sketch of a planar transferred electron device with biasing circuitry according to the prior art.

Referring to FIG. 1, a planar transferred electron logic device according to the prior art comprises a broad planar body of gallium arsenide material 11 on a block of semi-insulator material 12. The semi-insulator block 12 may be gallium arsenide material having a resistivity on the order of $10^6$ to $10^8$ ohm-cm. The material of the body 11 has, for example, a doping density of $1 \times 10^{16}$ cm$^{-3}$. The body 11 has a proper thickness and length so that, with its doping density, the device will operate as a planar transferred electron device.

Figure 2:
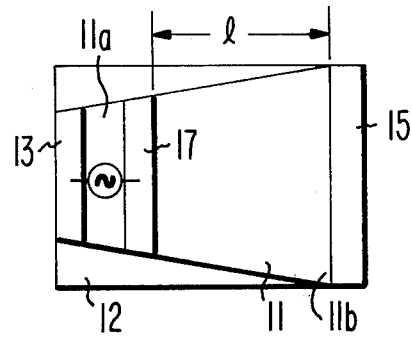
FIG. 2 is a top plan view of the arrangement shown in FIG. 1.

A cathode terminal 13 of conductive material is located on the top surface 14 and near one end 11a of planar body 11. An anode terminal 15 of conductive material is located on the top surface 14 and near the opposite end 11b of planar body 11. The body 11 is narrower near the cathode end 13 and broadens out linearly to the anode end 15. The anode end is, for example, about 1.5 times as wide as the cathode end. See FIG. 2. In the operation of the device, the electric fields are greater at the anode end. These fields can be so great that the metal at the anode terminal could migrate into the channel. By expanding the width near the anode end 11b, the high electric fields are reduced and metal migration is minimized. A schottky barrier gate terminal 17 is placed on top of the surface 14 of the body 11. For example, chrome may be evaporated on the semiconductor to form the Schottky barrier gate. This gate terminal 17 is spaced about $1 \times 10^{-4}$ cm. from the cathode terminal 13 in the direction of the anode. In the arrangement illustrated in FIG. 1, the length $l$ is the length between terminals 15 and 17. This length $l$ for a material with a doping density at $1 \times 10^{16}$ cm$^{-3}$ must be greater than about $1 \times 10^{-3}$ cm in order to maintain the $nl$ critical parameter of greater than $1 \times 10^{13}$ cm$^{-2}$. For a particular device using this material, a length $l$ of $2.9 \times 10^{-3}$ has been selected. For this device the spacing between the cathode terminal 13 and anode terminal 15 is about $3.5 \times 10^{-3}$ cm, and the gate width is about $5 \times 10^{-4}$ cm. The thickness ($d$) of the body 11 must be greater than about $1 \times 10^{-4}$ cm in order to maintain the critical $nd$ parameter of greater than $1 \times 10^{12}$ cm$^{-2}$. For the particular device selected, the material thickness was about $2 \times 10^{-4}$ cm. In order to achieve the transfer of electrons from the high mobility to the low mobility sub-band and to cause domains to form, this material must be biased above that of the threshold voltage. The threshold voltage for such a material is on the order of 3.2 to 3.5 kilovolts per cm.

A lesser voltage of, for example, 2.2 kilovolts per cm is all that is required to sustain domains.

Figure 3:
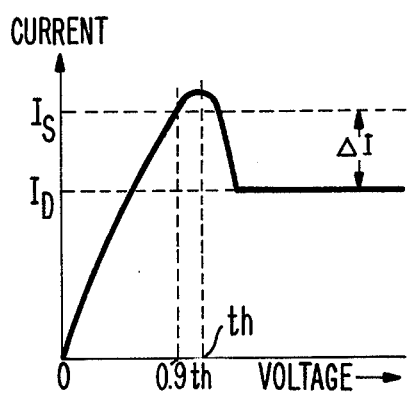
FIG. 3 is an I-V plot of the transferred electron device in FIG. 1.

A biasing field is provided by battery 19 which has the negative terminal end connected to cathode 13 and the positive terminal end connected to anode 15. The biasing voltage selected, for example, is about 0.9 times that of threshold. The battery voltage selected for the arrangement described in connection with FIG. 1 is 38 volts. About 10 volts appears across the device and the remaining voltage is dropped across a series resistor 18. At this voltage level across the device, domains are not formed but are sustained when formed. Signals for the logic device are coupled between the cathode terminal 13 and the gate terminal 17. Such signals could be, for example, continuous wave (CW) signals at microwave frequencies or pulses depending on the use. The signals applied to the gate terminal 17 cause a depletion region and, thus, an increase in the electric field in the region below the gate 17. The level of the signals applied to the gate are of a sufficient magnitude to create an electric field under the gate electrode that exceeds the threshold field whereby domains are generated. These domains are sustained and propagate from the gate 17 to the anode 15 due to the presence of the 0.9 times threshold field supplied by the battery 19. As can be seen viewing FIG. 3, the current at 0.9 times threshold bias is at a first level $I_s$. This current level $I_s$ is commonly referred to as the standoff or quiescent current level. When the signal applied to the gate 17 is of a level such as to increase the biasing field above threshold, the current decreases to a level $I_D$ in FIG. 3. This change of current $\Delta I$ is the output current change due to a change in state of this logic device. When the device is triggered by applying the external signal, the device current drops and the voltage across the load resistor 18 decreases, i.e. voltage across the device terminals 13 and 15 increases. The larger the voltage that is available across the device the larger the voltage swing and the more useable the device becomes.

Figure 4:
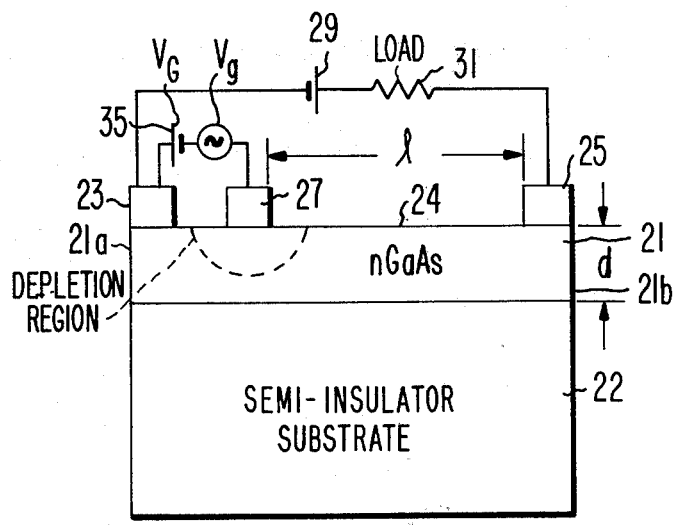
FIG. 4 is a functional sketch of a planar transferred electron logic device according to one embodiment of the present invention.
Figure 5:
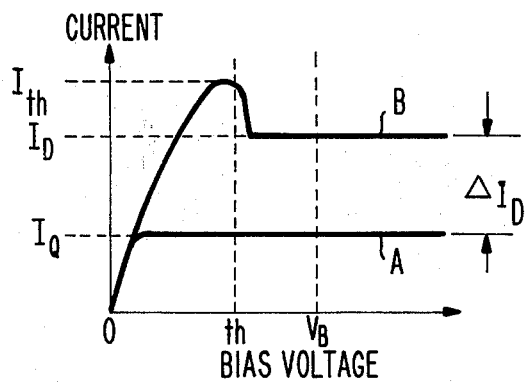
FIG. 5 is an I-V plot of the operational characteristics of the transferred electron device in FIG. 4.

Referring to FIG. 4, there is illustrated a planar transferred electron device according to the present invention with a body 21 of n- type gallium arsenide material grown on a semi-insulator substrate 22. The substrate 22 is like that described previously in connection with substrate 12 in FIG. 1. A conductive cathode terminal 23 is located on the top surface 24 and near one end 21a of the body 21. A conductive anode terminal 25 is located at the opposite end 21b of the body 21. The body 21 may be tapered as is the body 11 in FIG. 2. The body 21 is relatively narrow near the cathode 23 end and broadens linearly to the terminal 25. A gate terminal 27 is located near cathode terminal 23. For example, the spacing between the gate terminal 27 and anode terminal 25 is about $2.9 \times 10^{-3}$ cm. The spacing between the cathode terminal 23 and anode terminal 25 is about $3.5 \times 10^{-3}$ cm. The spacing between the gate terminal 27 and cathode terminal 25 is about $1 \times 10^{-4}$ cm. The battery 29 in series with the load 31 is connected between the cathode terminal 23 and anode terminal 25. The battery voltage, for example, for one embodiment, is on the order of 17 to 25 volts. This value depends on the value of the load resistor used. For the above example, a voltage of 10.5 volts is required for the material of body 21, the additional 6.5 to 14.5 volts being absorbed across the load resistor 31. The negative terminal of the battery 29 is connected to the cathode terminal 23, and the positive terminal of the battery 29 is connected through the load resistor 31 to the anode terminal 25. A second battery or source of potential 35 is connected between the cathode terminal 23 and the gate terminal 27. This second source 35 has the positive terminal coupled to the cathode 23 and the negative terminal coupled to the gate 27. The value of this source of potential 35 is such that this bias results in a gate which is heavily reverse biased with respect to the cathode. Under these conditions, the region under the gate 27 is depleted sufficiently so that the effective $nd$ product becomes less than the critical value required for domain nucleation or stated in another way there is insufficient mobile carriers to form the domains. The device current in the quiescent state is relatively low as represented by curve A in FIG. 5. The current in the quiescent state in FIG. 5 is represented by the maximum current level of $I_Q$. The input or control signals are coupled across the cathode and gate terminal or are superimposed on the reverse bias voltage from source 35. Positive-going control signals reduce the depletion region, causing the effective $nd$ value to become equal to or greater than the critical value and a domain is thus nucleated. The positive-going control signals must be above that amplitude necessary to cause the effective $nd$ value to be greater than the critical value and must be of a duration such as 5 – 20 pico-seconds to provide switching.

Curve B of FIG. 5 is a plot of the I–V characteristic when a control signal is applied above the given value to cause domain nucleation. When such a control signal is applied to gate 27, the current increases towards $I_{th}$ until a domain forms when the current attains a value $I_D$. Thus, the current increases as represented by $\Delta I_d$ in FIG. 5 from the quiescent value. This increase in current across the load resistance 31 causes a voltage change across the structure. If the input control signal pulse width is larger than the device transit time, the device exhibits current oscillations varying between $I_{th}$ and $I_D$ at the transit time frequency.

In the arrangement described above, the device standoff current or quiescent current is considerably decreased and so is the power dissipation. Also, since the device in the quiescent state is biased in the current saturation region, it is less likely to be triggered by noise or bias voltage fluctuations. Since, the domain dynamics still control the rise time (on the order of 5 to 15 picoseconds) of the output pulse, much lower delay dissipation products are feasible in this mode.

A first device like that described above in FIG. 4 had the following parameters:

| | |
|---|---|
| doping density (n) | = 6 to $9 \times 10^{16}$ cm$^{-3}$ |
| active layer 21 thickness (d) | = 0.45 to 0.6 microns |
| bias voltage of source 29 ($V_B$) | = 12.15 volts |
| device current | = 10.0 milliamps |
| reverse bias on gate 27 | = 4.0 volts |

In this device a 2 volts positive control signal was used to cause the change in state and the formation of domains. The pulse width of this control signal was 1 to 2 microsecond and the repitition rate was 100 KC. This first device was made by electrolytic etching for obtaining a uniform $nd$ product along the length of the entire layer 21. This is done by a process as described by D. L. Rode et al., in Solid-State Electronics, Vol. 17, PP 1119 – 1123 Nov. 1974.

A second device like that described above in FIG. 4 had the following parameters:

doping density (n) ≃ 2.5 × 16¹⁶ cm⁻³ nominal active layer 21 thickness (d) ≃ 2 microns nominal bias voltage 29 = 15.0 volts device current = 3.1 milliamperes reverse bias on gate 27 = 15.6 volts load resistor 31 = 560 ohms In this device a 40 to 50 millivolt positive control signal was required to cause the formation of domains. The pulse width of the input control signal was about 50 nanoseconds and the repetition rate was 100 KC.

Although in the arrangements described above, the reverse biasing of the gate to cathode is achieved by a separate bias source, this reverse biasing may be achieved by a proper location of the gate electrode with respect to the cathode electrode, where the gate electrode is returned to the same potential source as the cathode electrode through some resistor or capacitor. For a long length device, for example, the gate electrode may be sufficiently separated from the cathode electrode to achieve the reverse bias as given by:

$$V \text{ reverse bias} = V_d + 3.2 \times 10^3 \times \text{lcg}$$

where
    lcg = length between cathode and gate electrode $V_d$ = diffusion potential for Ga As (this is 0.8)

What is claimed is:

1. A planar transferred electron logic device comprising:
    a planar body of bulk semiconductor material of one conductivity type having a cathode conductive terminal near one end and an anode conductive terminal near the opposite end and a gating terminal spaced near said cathode terminal, said gating terminal comprising a conductive member adjacent to said body of semiconductor material to form a Schottky barrier junction therewith, said body material having a doping density, length and a thickness selected such that said body is characterized by a transfer of electrons from a high to a low mobility sub-band and the formation of domains upon the application of an electric field above threshold, means for applying a first D.C. potential of a first polarity across said cathode and anode terminals with a value above that of threshold, means for providing sufficient reverse biasing of the gate terminal with respect to said cathode terminal to suppress the formation of domains, said gating terminal being responsive to a control signal above a given level causing the formation of said domains.

2. The combination claimed in claim 1 wherein said means for providing reverse biasing includes a second D.C. potential source of a polarity the reverse of said first polarity.

3. The combination as claimed in claim 1 wherein said material of said body is such that the product of the length between said gating terminal and said second terminal times doping density is greater than $1 \times 10^{13}$ cm⁻² and the product of the thickness of the material of said body times the doping density is greater than $1 \times 10^{12}$ cm⁻².

* * * * *